United States Patent
Matsunaga et al.

(10) Patent No.: US 9,260,300 B2
(45) Date of Patent: Feb. 16, 2016

(54) PATTERN FORMATION METHOD AND PATTERN FORMATION APPARATUS

(71) Applicant: Kabushiki Kaisha Toshiba, Minato-ku (JP)

(72) Inventors: Kentaro Matsunaga, Mie-ken (JP); Nobuhiro Komine, Aichi-ken (JP); Eiji Yoneda, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/953,921

(22) Filed: Jul. 30, 2013

(65) Prior Publication Data

US 2014/0213058 A1 Jul. 31, 2014

(30) Foreign Application Priority Data

Jan. 29, 2013 (JP) .................... 2013-014360

(51) Int. Cl.
| | |
|---|---|
| C03C 15/00 | (2006.01) |
| B82Y 10/00 | (2011.01) |
| G03F 7/00 | (2006.01) |
| H01L 21/027 | (2006.01) |
| B82Y 40/00 | (2011.01) |

(52) U.S. Cl.
CPC ............... B82Y 10/00 (2013.01); B82Y 40/00 (2013.01); G03F 7/0002 (2013.01); H01L 21/0273 (2013.01)

(58) Field of Classification Search
CPC .......... G03F 7/0002; G03F 7/26; G03F 7/30; H01L 21/0273; H01L 21/0274; B82Y 10/00
USPC .............. 216/41, 42, 44, 48; 425/125, 174.4; 427/508, 510
See application file for complete search history.

(56) References Cited

U.S. PATENT DOCUMENTS

| | | | |
|---|---|---|---|
| 2008/0090170 A1 | 4/2008 | Yoneda | |
| 2009/0189317 A1* | 7/2009 | Sato et al. | 264/447 |
| 2010/0181289 A1* | 7/2010 | Sreenivasan et al. | 216/52 |
| 2011/0012297 A1 | 1/2011 | Kobiki et al. | |
| 2011/0315659 A1* | 12/2011 | Sekiguchi et al. | 216/37 |
| 2012/0189780 A1* | 7/2012 | LaBrake et al. | 427/510 |
| 2012/0292799 A1* | 11/2012 | Mutoh | 264/40.1 |
| 2013/0059090 A1* | 3/2013 | Kawamura | 427/511 |
| 2013/0217155 A1* | 8/2013 | Fukuhara et al. | 438/14 |
| 2013/0224322 A1* | 8/2013 | Shizawa et al. | 425/155 |

FOREIGN PATENT DOCUMENTS

| | | |
|---|---|---|
| JP | 2005-533393 A | 11/2005 |
| JP | 2007-19466 A | 1/2007 |
| JP | 2008-91782 A | 4/2008 |
| JP | 2011-18722 | 1/2011 |
| JP | 2011-23660 A | 2/2011 |
| JP | 2011-108805 A | 6/2011 |
| WO | WO 2004/016406 A1 | 2/2004 |

* cited by examiner

*Primary Examiner* — Binh X Tran
(74) *Attorney, Agent, or Firm* — Oblon, McClelland, Maier & Neustadt, L.L.P.

(57) ABSTRACT

According one embodiment, a pattern formation method forming a resist layer on a pattern formation surface by pressing a template provided with a concave-convex from above the resist layer to form a resist pattern on the pattern formation surface, includes: forming a resist layer in a first region having an area smaller than an area of the pattern formation surface and in a second region other than the first region of the pattern formation surface; pressing a template against the resist layer; irradiating the resist layer with light via the template to form a first resist layer in the first region, curing of the first resist layer being suppressed, and form the resist pattern including a second resist layer, curing of the second resist layer proceeds in the second region; and removing the first resist layer from the first region, the curing of the first resist layer being suppressed.

8 Claims, 9 Drawing Sheets

PATTERN FORMATION METHOD AND PATTERN FORMATION APPARATUS

CROSS-REFERENCE TO RELATED APPLICATIONS

This application is based upon and claims the benefit of priority from Japanese Patent Application No. 2013-014360, filed on Jan. 29, 2013; the entire contents of which are incorporated herein by reference.

FIELD

Embodiments described herein relate generally to a pattern formation method and a pattern formation apparatus.

BACKGROUND

With the progress of miniaturization and integration of semiconductor devices, it is required to increase the accuracy of photolithography apparatuses. However, when a miniaturization process of several tens of nanometers or less is performed, there is a resolution limit in photolithography technology. Thus, as a next-generation miniaturization process, nanoimprint technology is being introduced in wafer processes.

Also in nanoimprint technology, a simple and low cost patterning technique is required as in the case of photolithography technology.

DETAILED DESCRIPTION

Figure 1:
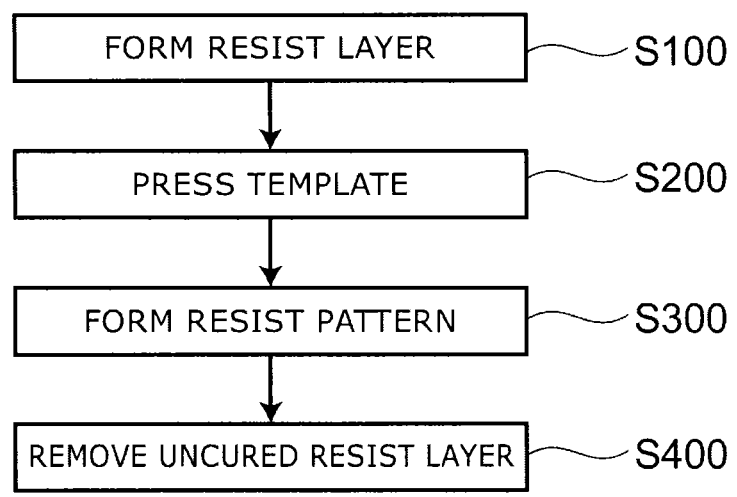
FIG. 1 is a diagram showing a flow of a pattern formation method according to a first embodiment.

In general, according one embodiment, a pattern formation method forming a resist layer on a pattern formation surface by pressing a template provided with a concave-convex from above the resist layer to form a resist pattern on the pattern formation surface, the method includes: forming a resist layer in a first region having an area smaller than an area of the pattern formation surface and in a second region other than the first region of the pattern formation surface; pressing a template against the resist layer; irradiating the resist layer with light via the template to form a first resist layer in the first region, curing of the first resist layer being suppressed, and form the resist pattern including a second resist layer, curing of the second resist layer proceeds in the second region; and removing the first resist layer from the first region, the curing of the first resist layer being suppressed.

Hereinbelow, embodiments are described with reference to the drawings. In the following description, identical components are marked with the same reference numerals, and a description of components once described is omitted as appropriate.

First Embodiment

FIG. 1 is a diagram showing the flow of a pattern formation method according to a first embodiment.

The pattern formation method according to the first embodiment is a pattern formation method that forms a resist layer on a pattern formation surface and presses a template provided with a concave-convex from above the resist layer to form a resist pattern on the pattern formation surface.

In the pattern formation method according to the first embodiment, first, a resist layer is formed in a first region having an area smaller than the area of a pattern formation surface and in a second region other than the first region (step S100). Here, in the case where the first region is a peripheral portion of a semiconductor wafer substrate, the area of the first region is smaller than the area of the second region.

Next, a template is pressed against the resist layer (step S200).

Next, the resist layer is irradiated with light via the template; thus, a resist layer (a first resist layer) in which curing is suppressed is formed in the first region, and a resist pattern including a resist layer (a second resist layer) in which curing has proceeded is formed in the second region (step S300).

Next, the resist layer (the first resist layer) in which curing is suppressed is removed from the first region (step S400).

A specific method of the pattern formation method according to the first embodiment will now be described.

FIG. 2A to FIG. 3C are schematic cross-sectional views showing a pattern formation method according to the first embodiment.

Figure 2A:
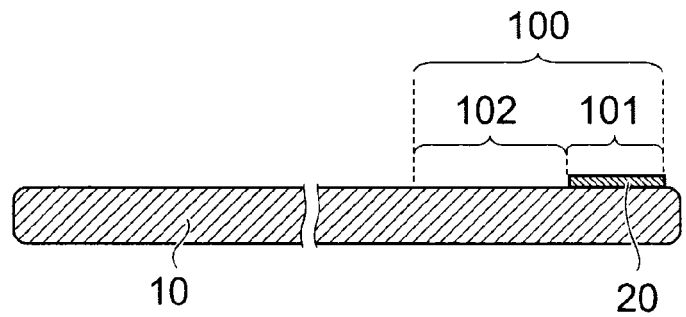
FIG. 2A to FIG. 3C are schematic cross-sectional views showing a pattern formation method according to the first embodiment.

As shown in FIG. 2A, a pattern formation surface 100 of a semiconductor wafer 10 has a first region 101 and a second region 102. The first region 101 is, for example, a peripheral portion of the semiconductor wafer 10. In the case where the diameter of the semiconductor wafer 10 is 8 inches or more, the width of the first region 101 in the cross-sectional view is 2 mm to 3 mm. The peripheral portion is an unused region where elements, interconnections, insulating films, etc. are not formed. The second region is a region where elements, interconnections, insulating films, etc. are formed. In the second region, nanoimprinting is performed in order to perform miniaturization processing in the wafer process. The semiconductor wafer 10 is located in a gas atmosphere of argon (Ar), nitrogen ($N_2$), or the like.

First, as shown in FIG. 2A, a chemical liquid 20 is supplied to the first region 101. The chemical liquid 20 is a chemical liquid that suppresses the curing of a resist layer. The chemical liquid 20 is supplied to the first region 101 by, for example, the application method. Specific supply methods include a selective application method using ink jetting, a nozzle application method that applies a chemical liquid selectively to a peripheral portion of the semiconductor wafer 10, etc.

The chemical liquid 20 contains a radical polymerization inhibitor that suppresses the radical polymerization of a resist. In the chemical liquid 20, for example, when light is applied, hydrogen contained in the polymerization inhibitor is pulled out by radicals resulting from monomers, and the polymerization inhibitor forms stable radicals and stops the polymerization of the monomers. The chemical liquid 20 is, for example, hydroquinone, methylhydroquinone, benzoquinone, 2,2,6,6-tetramethylpiperidine-1-oxy, 2,2-diphenyl-1-picrylhydrazyl, 4-methoxyphenol, or phenothiazine, and so on or a solution thereof.

Figure 2B:
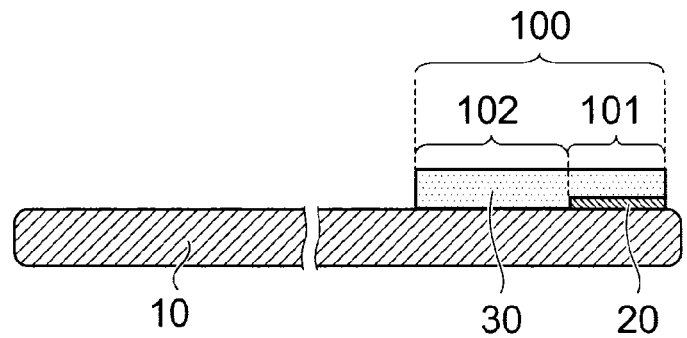

Next, as shown in FIG. 2B, a resist layer 30 is formed in the first region 101 and the second region 102. In the first region 101, the chemical liquid 20 is covered by the resist layer 30. Alternatively, in the first region 101, part of the chemical liquid 20 permeates into the resist layer 30.

The resist layer 30 is, for example, a negative resist. That is, when irradiated with light, the resist layer 30 produces a cross-linking reaction and decreases in solubility in thinner such as organic solvents. In the resist layer 30, the curing (solidification) of the portion irradiated with light proceeds. However, in the resist layer 30, when oxygen is present, radical polymerization is inhibited and the curing of the resist layer 30 is suppressed even upon light irradiation. The resist layer 30 is formed of, for example, a material in which monomers including acrylate groups, methacrylate groups, vinyl groups, and/or allyl groups are polymerized.

Figure 2C:
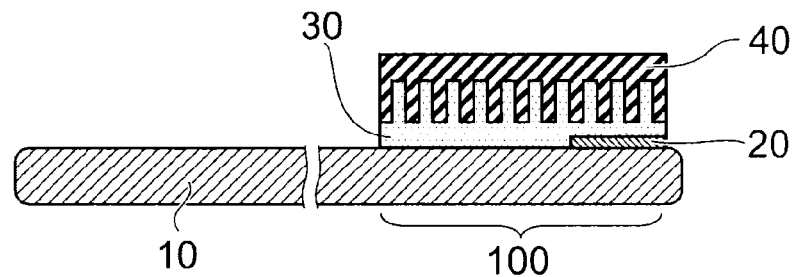

Next, as shown in FIG. 2C, a template 40 is pressed against the resist layer 30. Thereby, the concave-convex of the template 40 is transferred to the resist layer 30.

Figure 2D:
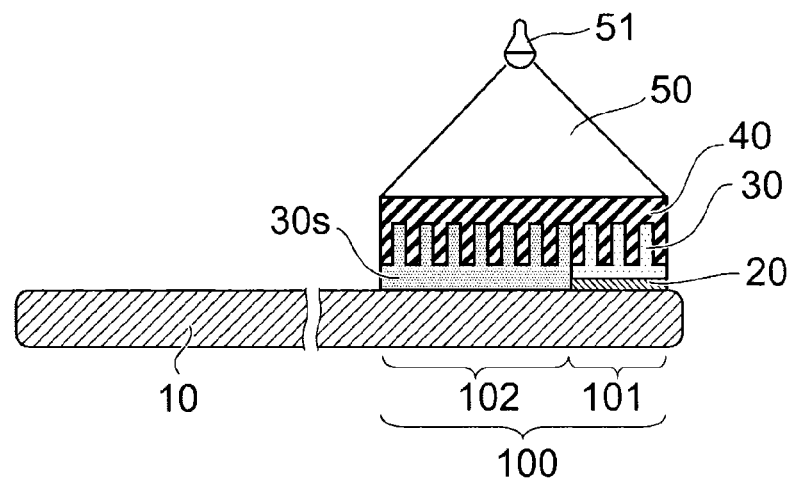

Next, as shown in FIG. 2D, the resist layer 30 is irradiated with light 50 via the template 40. The light 50 is, for example, UV (ultraviolet) light. The light 50 is emitted from a light source 51 installed above the template 40.

As described above, the resist layer 30 includes a negative resist. Therefore, when the resist layer 30 is irradiated with light 50, the curing of the portion irradiated with light of the resist layer 30 proceeds. In the first embodiment, a mask that selectively blocks light 50 is not provided between the template 40 and the light source 51. In the first embodiment, light 50 is applied to almost the entire region of the template 40. The resist layer after curing has proceeded is referred to as a resist layer 30s.

However, in the first region, when light 50 is applied, a reaction that inhibits the polymerization of the resist 30 occurs due to the action of the chemical liquid 20. Consequently, in the resist layer 30 in the first region, the radical polymerization of the resist layer 30 is inhibited to suppress the curing of the resist layer. That is, the resist layer 30 in which curing is suppressed is formed in the first region 101, and a resist pattern including the resist layer 30s in which curing has proceeded is formed in the second region 102.

Figure 3A:
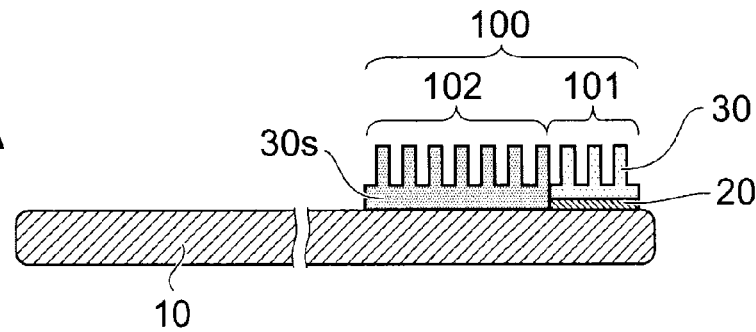

Next, as shown in FIG. 3A, the template 40 is removed from the pattern formation surface 100.

Figure 3B:
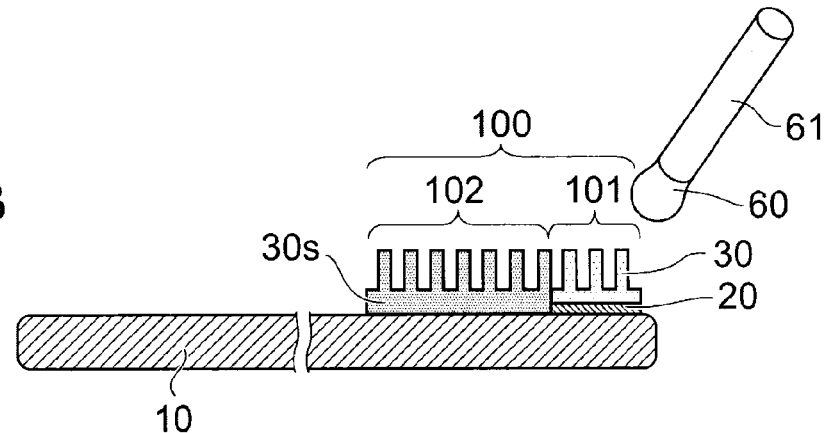

Next, as shown in FIG. 3B, an organic solvent 60 is discharged from a nozzle 61 and the organic solvent 60 is supplied to the pattern formation surface 100. The organic solvent 60 may be supplied preferentially to the resist layer 30 in the first region 101.

The organic solvent 60 contains, for example, a cyclic hydrocarbon such as cyclohexane, an aromatic compound such as toluene, an acetic ester, an alcohol, or the like. The resist layer 30s in which curing has proceeded exhibits low solubility in the organic solvent 60, and the resist layer 30 in which curing is suppressed exhibits solubility in the organic solvent 60.

Figure 3C:
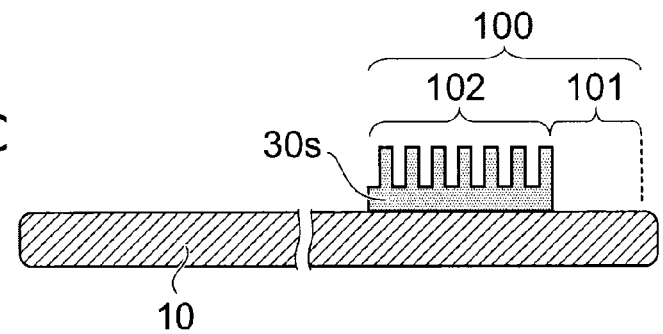

As a result, as shown in FIG. 3C, the resist layer 30 in which curing is suppressed is selectively removed from the first region 101. The resist layer 30s is left in the second region 102.

Figure 4:
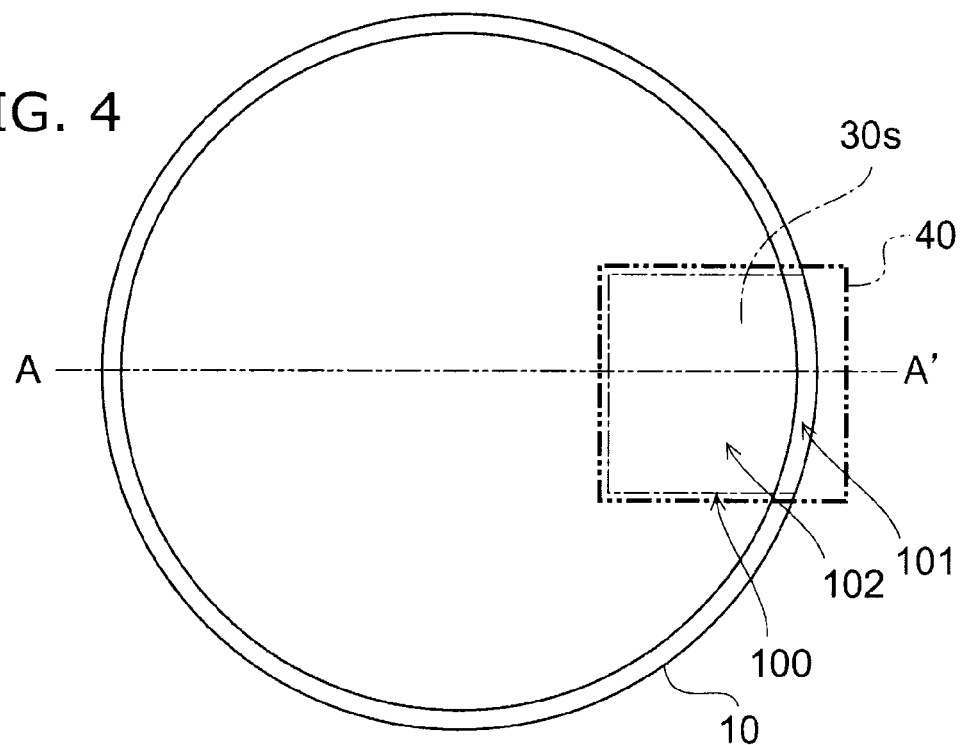
FIG. 4 is a schematic plan view showing the pattern formation method according to the first embodiment.

FIG. 4 is a schematic plan view showing the pattern formation method according to the first embodiment.

FIG. 4 shows the state of FIG. 3C as viewed from above the resist layer 30s. The cross section in the position of line A-A' of FIG. 4 corresponds to FIG. 3C. The peripheral portion (unused region) of the semiconductor wafer 10 corresponds to the first region 101 of the pattern formation surface 100.

As shown in FIG. 4, the patterned resist layer 30s has been formed in the second region 102 of the pattern formation surface 100. The resist layer 30 has been removed from the first region 101 of the pattern formation surface 100. By such a flow, a resist pattern is formed.

The resist patterning according to the first embodiment is not limited to the pattern formation surface 100 shown in FIG. 4, and may be performed on a surface of the semiconductor wafer 10 other than the pattern formation surface 100. That is, the number of pattern formation surfaces 100 is not limited to one, and a surface of the semiconductor wafer 10 other than the pattern formation surface 100 illustrated may be used separately as a pattern formation surface. In the first embodiment, merely one pattern formation surface 100 is illustrated as an example.

Figure 5:
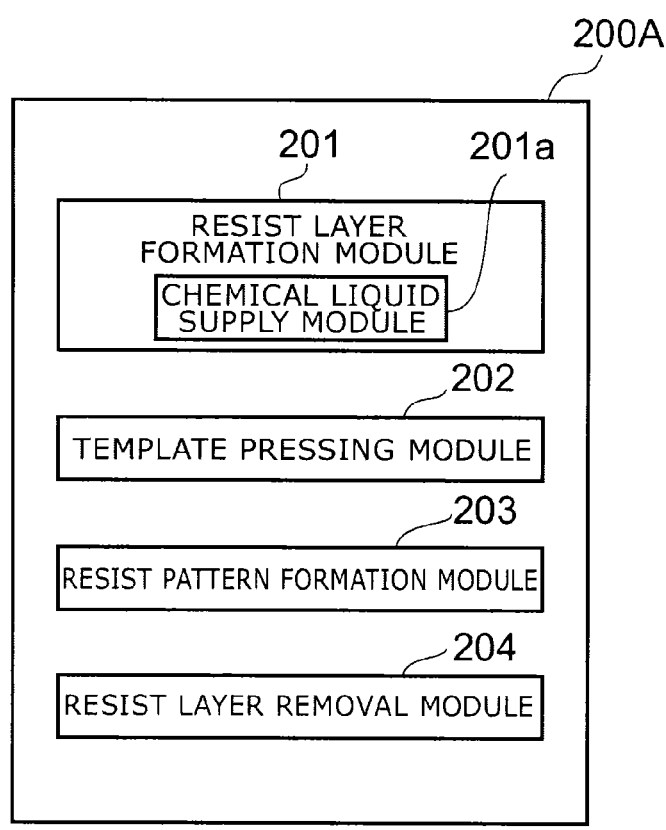
FIG. 5 is a block diagram showing a pattern formation apparatus according to the first embodiment.

FIG. 5 is a block diagram showing a pattern formation apparatus according to the first embodiment.

A pattern formation apparatus 200A is a pattern formation apparatus that forms the resist layer 30 on the pattern formation surface 100 and presses the template 40 provided with a concave-convex from above the resist layer 30 to form a resist pattern on the pattern formation surface 100.

The pattern formation apparatus 200A includes a resist layer formation module 201 (a first module), a template pressing module 202 (a second module), a resist pattern formation module 203 (a third module), and a resist removal module 204 (a fourth module).

The resist layer formation module 201 can form the resist layer 30 in the first region 101 having an area smaller than the area of the pattern formation surface 100 of the semiconductor wafer 10 and in the second region 102 other than the first region 101 of the pattern formation surface 100.

The template pressing module 202 can press the template 40 against the resist layer 30.

The resist pattern formation module 203 can irradiate the resist layer 30 with light via the template 40 to form in the first region 101 the resist layer 30 in which curing is suppressed and form in the second region 102 a resist pattern including the resist layer 30s in which curing has proceeded.

The resist removal module 204 can remove from the first region 101 the resist layer 30 in which curing is suppressed.

The resist layer formation module 201 includes a chemical liquid supply module 201a. The chemical liquid supply module 201a can supply to the first region 101 the chemical liquid 20 that suppresses the curing of the resist layer 30 before the template 40 is pressed against the resist layer 30. The chemical liquid supply module 201a is, for example, a module that supplies the chemical liquid 20 to the first region 101 by the application method.

As methods for not forming a resist pattern in the peripheral portion of the semiconductor wafer 10, the methods illustrated below are given.

Figure 6A:
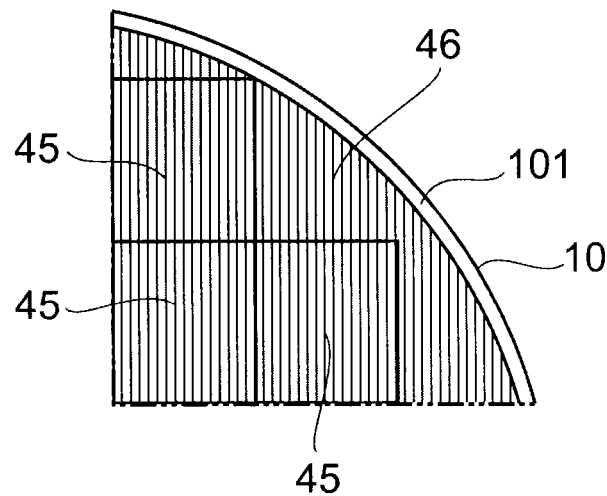
FIGS. 6A to 6C are schematic plan views showing pattern formation methods according to reference examples.
Figure 6B:
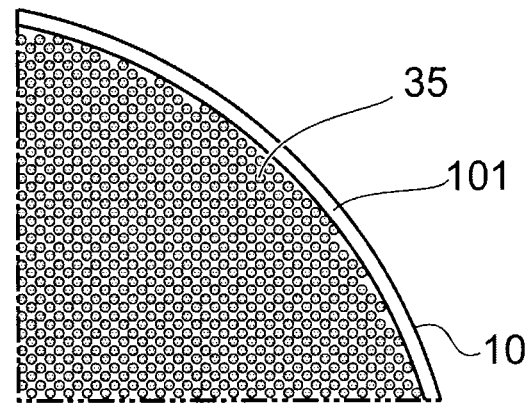
Figure 6C:
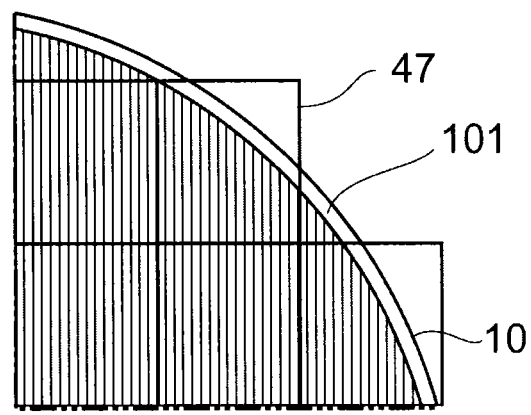

FIGS. 6A to 6C are schematic plan views showing pattern formation methods according to reference examples.

FIG. 6A to FIG. 6C show a quarter of the semiconductor wafer 10.

For example, FIG. 6A illustrates a method in which a template 45 for the inner region of the semiconductor wafer 10 and a template 46 for the peripheral portion of the semiconductor wafer 10 are used to be switched to each other according to circumstances.

However, in this method, it is necessary to prepare the template 46 in addition to the template 45. The template 46 is a dedicated template having a pattern of the first region 101 as well as a concavo-convex pattern for nanoimprinting. Therefore, this method causes a cost increase.

FIG. 6B illustrates a method in which a plurality of resist drops 35 are formed in a region other than the peripheral portion of the semiconductor wafer 10 by the resist drop method.

However, it is difficult to accurately control the position of each of the plurality of resist drops 35 in the entire region of the pattern formation surface. Therefore, this method needs a long time for the optimization of formation conditions. In addition, the program for the control is complicated. Furthermore, cost reduction is difficult.

FIG. 6C illustrates a method in which a resist layer formed in the first region 101 is not light-cured but the resist layer 30 formed in the first region 101 is made to be absorbed into a template 47. However, also in this case, it is necessary to prepare the template 47 exclusively for the peripheral portion of the semiconductor wafer 10, and a cost increase is caused.

Although not illustrated, there is also a method in which the first region 101 is not selectively irradiated with light. However, this method needs a dedicated mask that prevents light from reaching the first region 101. Therefore, a cost increase is caused.

In contrast, the first embodiment does not need an exclusive template (or a dedicated template) for the peripheral portion of the semiconductor wafer 10. In the first embodiment, the template for the inner region of the semiconductor wafer 10 can be used also as a template for the peripheral portion of the semiconductor wafer 10 as it is.

After nanoimprinting, it is preferable that the resist layer 30 is not left in the peripheral portion of the semiconductor wafer 10. This is because the resist layer 30 left in the peripheral portion of the semiconductor wafer 10 is a factor in dust generation in the postprocess of nanoimprinting.

In the first embodiment, even when nanoimprinting is performed, the resist layer 30 is removed with reliability from the peripheral portion of the semiconductor wafer 10, and the resist layer 30 does not protrude to the peripheral portion of the semiconductor wafer 10. Thereby, dust generation due to the resist layer is prevented.

The first embodiment does not require so complicated a control technique as the resist drop method. Furthermore, a dedicated mask member that prevents light from reaching the first region 101 is not needed.

Thus, by the first embodiment, simplification of pattern formation conditions, shortening of the time of pattern formation, and cost reduction in pattern formation are achieved in nanoimprinting.

Second Embodiment

Figure 7A:
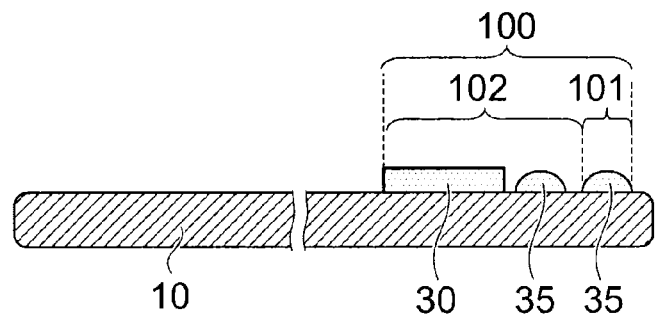
FIG. 7A to FIG. 9B are schematic cross-sectional views showing a pattern formation method according to a third embodiment.
Figure 7B:
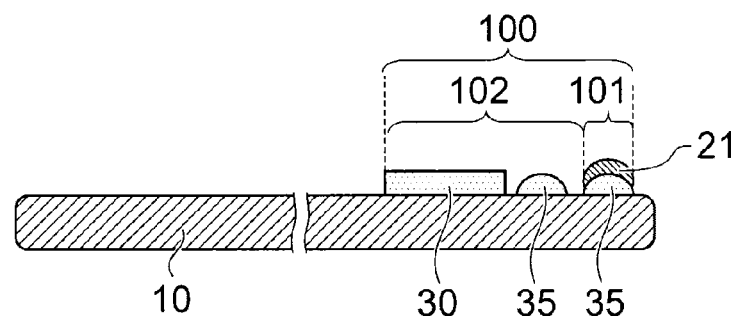
Figure 7C:
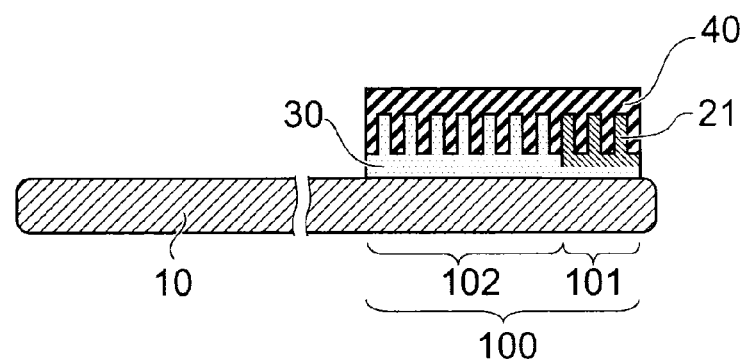

FIG. 7A to FIG. 7C are schematic cross-sectional views showing a pattern formation method according to a second embodiment.

First, as shown in FIG. 7A, a resist drop 35 is dropped onto the first region 101 by the resist drop method. The resist drop method is a method that drops a minute resist in a liquid drop form onto a pattern formation surface. The resist drop 35 is a minute resist in a liquid drop form. In other words, droplets of the minute resist are dropped onto a pattern formation surface in the resist drop method. The components of the resist drop 35 are the same as those of the resist layer 30.

The resist layer 30 is formed in the second region 102. FIG. 7A illustrates a state where in addition to the resist layer 30, the resist drop 35 is dropped on the second region 102. In the second region 102, it is also possible to form only the resist layer 30 without dropping the resist drop 35.

Next, as shown in FIG. 7B, a minute chemical liquid 21 in a liquid drop form is dropped onto the resist drop 35 provided in the first region 101. The method for dropping the chemical liquid 21 is the same as the resist drop method. The components of the chemical liquid 21 are the same as those of the chemical liquid 20. That is, in the second embodiment, the chemical liquid 21 of the same components as the chemical liquid 20 is supplied to the first region 101 by dropping the minute chemical liquid 21 in a liquid drop form. Part of the chemical liquid 21 may permeate into the resist drop 35 due to the lapse of a certain period of time.

Next, as shown in FIG. 7C, the template 40 is pressed against the resist layer 30 and the resist drop 35. Thereby, the concave-convex of the template 40 is transferred to the resist layer 30 and the resist drop 35. After the template 40 is pressed, the resist layer 30 and the resist drop 35 are mixed together to form the resist layer 30 between the template 40 and the semiconductor wafer 10.

After that, similarly to the first embodiment, the resist layer 30 is irradiated with light 50 via the template 40. Further, the template 40 is removed, and the uncured resist layer 30 provided in the first region 101 is selectively removed.

The basic structure of the pattern formation apparatus 200A according to the second embodiment is the same as the pattern formation apparatus 200A according to the first embodiment. However, the chemical liquid supply module 201a of the pattern formation apparatus 200A according to the second embodiment is, for example, a module that supplies the chemical liquid 21 to the first region 101 by dropping the chemical liquid 21 in a liquid drop form.

Also in the second embodiment, the same effects as the first embodiment are obtained. In the second embodiment, since the resist drop method is used for the supply to the first region 101, the protrusion of the resist from between the template 40 and the semiconductor wafer 10 is more suppressed in the stage shown in FIG. 7C.

Although FIG. 7A to FIG. 7B illustrate a sequence in which the chemical liquid 21 is dropped onto the resist drop 35, it is also possible to drop the chemical liquid 21 onto the first region beforehand and drop the resist drop 35 onto the chemical liquid 21.

Third Embodiment

FIG. 8A to FIG. 9B are schematic cross-sectional views showing a pattern formation method according to a third embodiment.

Figure 8A:
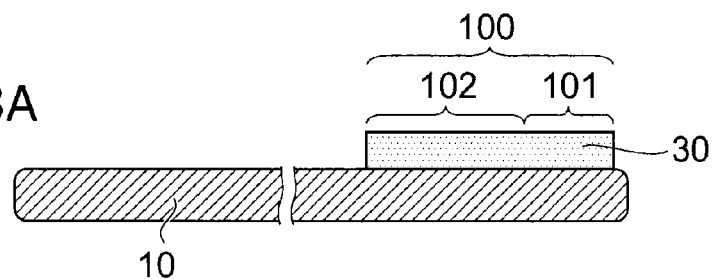

First, as shown in FIG. 8A, the resist layer 30 is formed in the first region 101 and the second region 102.

Figure 8B:
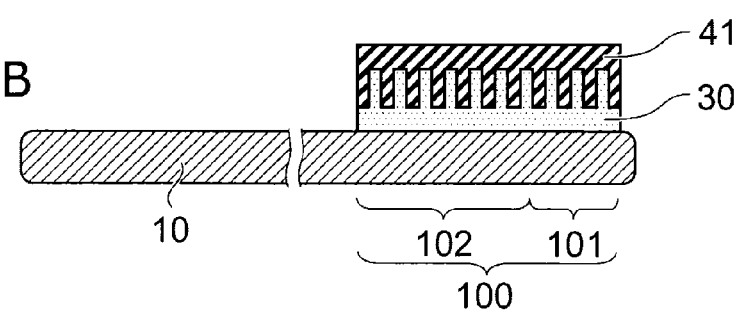

Next, as shown in FIG. 8B, a template 41 is pressed against the resist layer 30. Thereby, the concave-convex of the template 41 is transferred to the resist layer 30. Here, the template 41 is a gas permeable template. The template 41 contains, for example, a porous material. In the template 41, gas permeates between the concavo-convex surface of the template 41 and the surface on the opposite side to the concavo-convex surface.

Figure 8C:
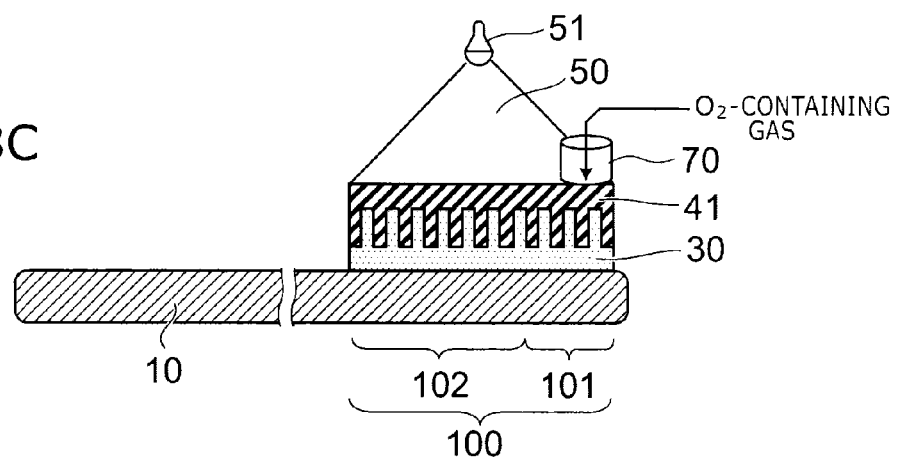

Next, as shown in FIG. 8C, a pipe 70 is installed above the first region 101. Subsequently, an oxygen-containing gas is jetted to the template 41 side via the pipe 70. The resist layer 30 is irradiated with light 50 via the template 41.

As described above, the resist layer 30 includes a negative resist. Therefore, when the resist layer 30 is irradiated with light 50, the curing of the portion irradiated with light of the resist layer 30 proceeds. However, while the resist layer 30 is irradiated with light 50, an oxygen-containing gas is supplied to the resist layer 30 formed in the first region 101 via the template 41.

Consequently, in the resist layer 30 in the first region, the radical polymerization of the resist layer 30 is inhibited and the curing of the resist layer is suppressed. That is, the resist layer 30 in which curing is suppressed is formed in the first region 101. In the second region 102, a resist pattern including the resist layer 30s in which curing has proceeded is formed. This state is shown in FIG. 9A.

Figure 9A:
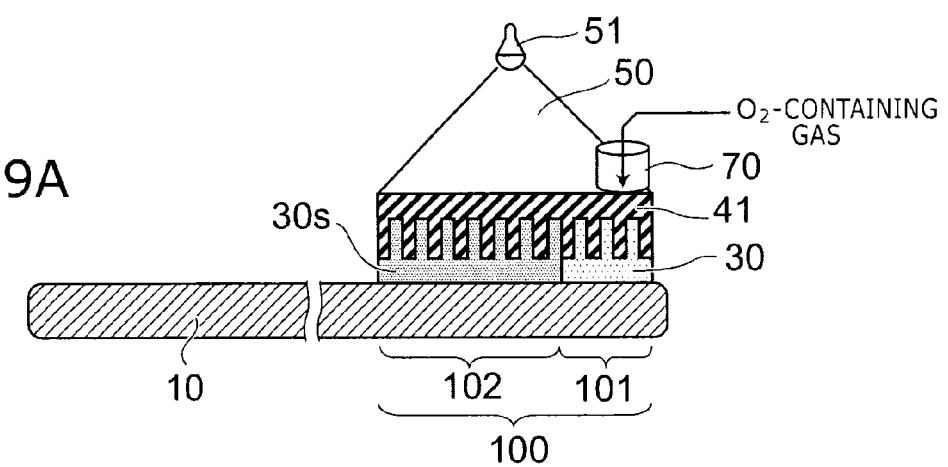

As shown in FIG. 9A, the resist layer 30s in which curing has proceeded is formed in the second region 102. The resist layer in the first region 101 remains the resist layer 30 in which curing is suppressed.

Figure 9B:
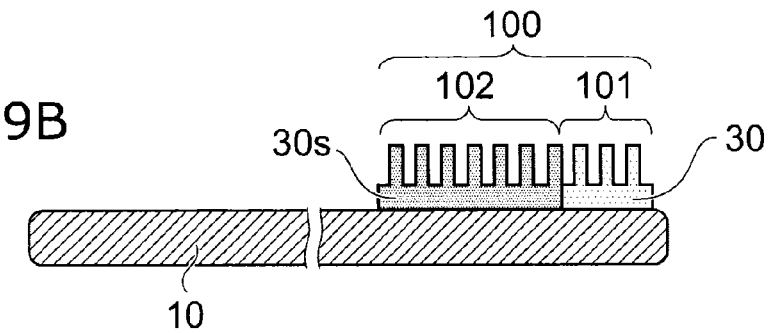

Next, as shown in FIG. 9B, the template 41 is removed. After that, the resist layer 30 formed in the first region 101 is selectively removed. In the second region 102, the resist layer 30s is left.

Figure 10:
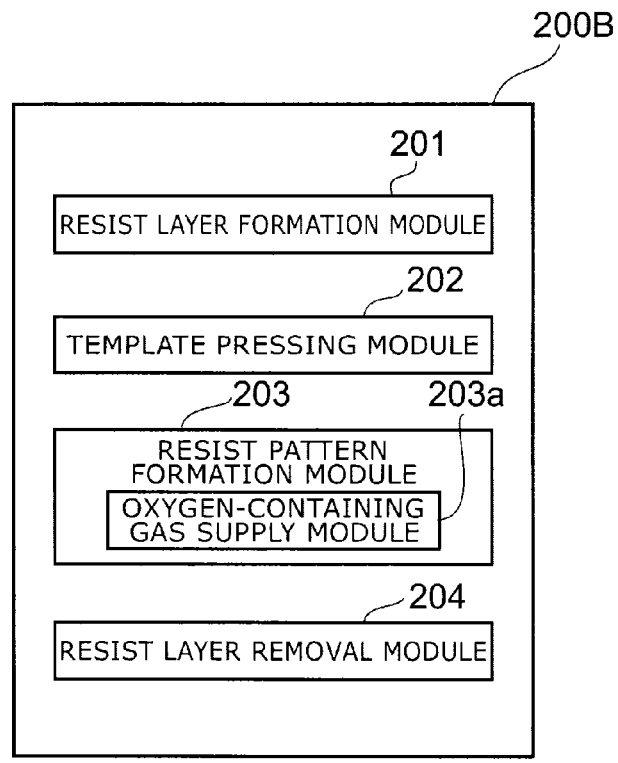
FIG. 10 is a block diagram showing a pattern formation apparatus according to the third embodiment.

FIG. 10 is a block diagram showing a pattern formation apparatus according to the third embodiment.

The basic structure of a pattern formation apparatus 200B is the same as the basic structure of the pattern formation apparatus 200A. The pattern formation apparatus 200B includes the resist layer formation module 201 (the first module), the template pressing module 202 (the second module), the resist pattern formation module 203 (the third module), and the resist removal module 204 (the fourth module).

The resist pattern formation module 203 includes an oxygen-containing gas supply module 203a. The oxygen-containing gas supply module 203a is a module that supplies an oxygen-containing gas to the resist layer 30 via the template 41. The oxygen-containing gas supply module 203a can supply an oxygen-containing gas to the resist layer 30 formed in the first region 101 while the resist layer 30 is irradiated with light 50. Also in the third embodiment, the same effects as the first embodiment are obtained.

Fourth Embodiment

Figure 11:
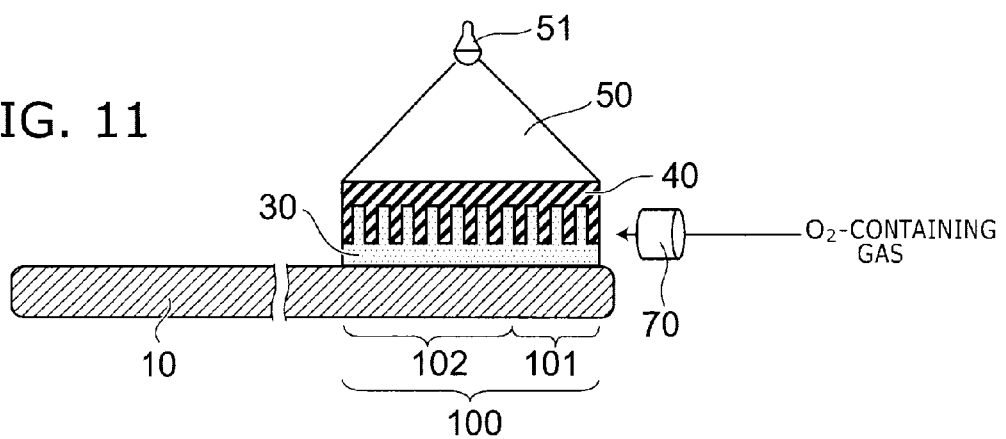
FIG. 11 is a schematic cross-sectional view showing a pattern formation method according to a fourth embodiment.

FIG. 11 is a schematic cross-sectional view showing a pattern formation method according to a fourth embodiment.

The method for supplying an oxygen-containing gas to the first region 101 is not limited to the method of the third embodiment. In the fourth embodiment, as shown in FIG. 11, an oxygen-containing gas is supplied to the resist layer 30 via between the template 40 and the resist layer 30. The template 40 may be replaced with the template 41 described above.

For example, the pipe 70 is installed on the lateral side of the side surface of the template 40. An oxygen-containing gas is jetted to the lateral side of the template 40 via the pipe 70. The oxygen-containing gas gets between the template 40 and the resist layer 30, and is supplied up to the resist layer 30 in the first region 101.

The basic structure of the pattern formation apparatus 200B according to the fourth embodiment is the same as the basic structure of the pattern formation apparatus 200B according to the third embodiment. The oxygen-containing gas supply module 203a is a module that supplies an oxygen-containing gas to the resist layer 30 via between the template 40 and the resist layer 30. Also in the fourth embodiment, the same effects as the first embodiment are obtained.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

The term "on" in "a portion A is provided on a portion B" refers to the case where the portion A is provided on the portion B such that the portion A is in contact with the portion B and the case where the portion A is provided above the portion B such that the portion A is not in contact with the portion B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation apparatus forming a resist pattern on a pattern formation surface by pressing a template against a resist layer formed on the pattern formation surface, the template having a concave-convex, the apparatus comprising:
    a first module configured to form the resist layer in a first region and a second region on the pattern formation surface, the first region being smaller than the second region, the first region being provided at a peripheral portion of the pattern formation surface;
    a second module configured to press the template against the resist layer;
    a third module configured to irradiate the resist layer with light via the template to form the resist pattern including a first resist layer in the first region and a second resist layer in the second region, curing of the first resist layer being suppressed, and curing of the second resist layer proceeds;
    a fourth module configured to remove the first resist layer from the first region; and
    a fifth module configured to suppress curing of the first resist layer before or while irradiating the resist layer with the light.

2. The apparatus according to claim 1, wherein the fifth module includes a module configured to supply to the first region a chemical liquid suppressing curing of the resist layer before the template is pressed against the resist layer.

3. The apparatus according to claim 2, wherein the chemical liquid contains an oxygen generator.

4. The apparatus according to claim 2, wherein the chemical liquid is supplied to the first region by an application method.

5. The apparatus according to claim 2, wherein a droplet the chemical liquid is supplied to the first region by dropping the chemical liquid.

6. The apparatus according to claim 1, wherein the fifth module includes a module configured to supply an oxygen-containing gas to the resist layer formed in the first region while the resist layer is irradiated with the light.

7. The apparatus according to claim 6, wherein the module configured to supply the oxygen-containing gas supplies the oxygen-containing gas to the resist layer via the template.

8. The apparatus according to claim 6, wherein the module configured to supply the oxygen-containing gas supplies the oxygen-containing gas to the resist layer via between the template and the resist layer.

* * * * *